(12) United States Patent (10) Patent No.: US 6,782,501 B2
Distler et al. (45) Date of Patent: Aug. 24, 2004

(54) SYSTEM FOR REDUCING TEST DATA VOLUME IN THE TESTING OF LOGIC PRODUCTS

(75) Inventors: Frank O. Distler, Williston, VT (US); L. Owen Farnsworth, Lincoln, VT (US); Andrew Ferko, Waterbury, VT (US); Brion L. Keller, Conklin, NY (US); Bernd K. Koenemann, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 375 days.

(21) Appl. No.: 09/972,000

(22) Filed: Oct. 5, 2001

(65) Prior Publication Data

US 2002/0099992 A1 Jul. 25, 2002

Related U.S. Application Data

(63) Continuation-in-part of application No. 09/768,121, filed on Jan. 23, 2001.

(51) Int. Cl.$^7$ .......................... G06F 11/00; G06F 17/50; G01R 31/28
(52) U.S. Cl. .......................... 714/738; 714/728; 703/13
(58) Field of Search .................................. 714/738, 741, 714/732, 726, 724, 734, 736, 728, 32, 33; 703/13, 14; 341/94

(56) References Cited

U.S. PATENT DOCUMENTS

| | | | |
|---|---|---|---|
| 3,783,254 A | | 1/1974 | Eichelberger |
| 4,428,060 A | | 1/1984 | Blum |
| 4,498,172 A | * | 2/1985 | Bhavsar ...................... 714/732 |
| 4,536,881 A | * | 8/1985 | Kasuya ......................... 377/70 |
| 5,377,197 A | | 12/1994 | Patel et al. |
| 5,392,298 A | | 2/1995 | Shinjo |
| 5,544,173 A | | 8/1996 | Meltzer |
| 5,748,497 A | | 5/1998 | Scott et al. |
| 5,831,992 A | * | 11/1998 | Wu ............................ 714/732 |
| 6,327,687 B1 | * | 12/2001 | Rajski et al. ................ 714/738 |

OTHER PUBLICATIONS

IBM Technical Disclosure Bulletin, "Test Time/Data Volume Reduction Technique" T.W. Sehr, vol. 24, No. 5, Oct. 1981; pp. 2560–2562.
IBM Technical Disclosure Bulletin, "Method for Masking Unpredictable Shift Register Latch States During Random Pattern Self–Test", K.T. Kaliszewski; vol. 36, No. 02, Feb. 1993; pp. 239–241.

* cited by examiner

*Primary Examiner*—Christine T. Tu
(74) *Attorney, Agent, or Firm*—Orrick Herrington & Sutcliffe (57) ABSTRACT

A system for reducing test data volume in the testing of logic products such as modules on integrated circuit chips, and systems comprised of multiple integrated circuit chips. Test stimulus data are loaded from a tester into the logic product to apply to portions of combinational logic circuitry therein in order to detect faults comprises "care" bits and "non-care" bits. The care bits target focal faults of interest in the logic circuitry being tested while the non-care bits do not. Non-care bits in the test vector data are filled with repetitive, repeating, or other background data sequences. The background data sequences are constructed such that they can be algorithmically recovered from a small amount of initialization data. The recovery can use hardware that is located in the product under test, inside the tester, or between the product under test and the tester, or software residing in the tester and operating while the test is performed. The software and/or hardware recover the full test input stimulus data including the fill data from the much more compact source data. The use of a compacted data format for the fill data provides for a high degree of compressibility of the total test input stimulus vector data set. The method for test data reduction combines the compact data representation for the input stimulus data with on-product or off-product compression of the test response data. The response data compression can be accomplished by the use of error-detecting codes, by comparing the responses from several identical products under test. The combination of data compression techniques for both, test input stimulus data and test output response data, results in significantly better overall data reduction.

18 Claims, 8 Drawing Sheets

|   | 1 | 2 | 3 | 4 | 5 | 6 |   |   |   |
|---|---|---|---|---|---|---|---|---|---|
| 1 | – | 0 | – | 1 | – | – | – | – | – |
| 2 | – | – | 0 | – | 1 | – | – | – | – |
|   | – | – | – | 1 | – | 1 | – | – | – |
|   |   |   |   |   | – | – | – | – | – |

TEST VECTORS

FIG. 5A

|   | 1 | 2 | 3 | 4 | 5 | 6 |   |   |   |
|---|---|---|---|---|---|---|---|---|---|
| 1 | 1 | 0 | 1 | 0 | 1 | 0 | 1 | 0 | 1 |
| 2 | 1 | 1 | 0 | 1 | 0 | 1 | 0 | 1 | 0 |
|   | 0 | 1 | 1 | 0 | 1 | 1 | 0 | 0 | 1 |
|   |   |   |   |   | 0 | 0 | 1 | 0 | 1 |

BACKGROUND VECTORS

FIG. 5B

|   | 1 | 2 | 3 | 4 | 5 | 6 |   |   |   |
|---|---|---|---|---|---|---|---|---|---|
| 1 | – | 0 | – | 1 | – | – | – | – | – |
| 2 | – | – | 0 | – | 1 | – | – | – | – |
|   | – | – | – | 1 | – | 0 | – | – | – |
|   |   |   |   |   | – | – | – | – | – |

DIFFERENTIAL VECTORS

SYSTEM FOR REDUCING TEST DATA VOLUME IN THE TESTING OF LOGIC PRODUCTS

This is a continuation-in-part of patent application Ser. No. 09/768,121 filed Jan. 23, 2001.

BACKGROUND OF THE INVENTION

The present invention relates to a method and system for compressing test data used in the testing of logic products such as integrated circuit chips and the like, to economize on the amount of computer memory, disk storage and time required to test such products.

In the testing of devices utilized in computers, such as combinational logic circuit chips and memory arrays, tester devices are used. To test, for example, a combinational logic circuit, a tester applies stimuli to inputs of the chip, and resulting output responses are observed in order to detect faults in an expected performance of the logic circuit. The detected faults may be used to debug the circuit design.

One method of applying test stimuli to a logic circuit includes placing "scan latches" before and after the combinational logic circuits to be tested. In this method, test data is clocked or scanned from a data input pin to a chain of input latches. The test data typically comprises 0s and 1s which may be arranged as a plurality of vectors. The test vector data comprises "care" bits and "non-care" bits. Care bits are bits which are set by test-generating software to target specific or "focal" faults in the logic being tested. Non-care bits are not targeted toward any particular focal fault. A chain of input latches loaded with test vector data may be referred to as a "scan chain."

According to the method, application of the test vectors to the combinational logic does not begin until all of the input latches are filled using scan chains. Once all the input latches are filled, the test vectors are released and applied to the combinational logic. The combinational logic processes the test vectors and captures the results in latches, and from there the results are scanned to a test output pin where faults may be detected.

Advances in computer technology have permitted significant increases in the density with which logic circuits can be packed onto a chip, and accordingly, the number of functions and operations that a chip can perform has increased significantly. Attendant to the increased density and number of logic circuits on a chip, there is an increase in the number, complexity and size of test vectors which need to be applied by a tester to fully verify the chip's operation. Along with the increased volume of test vectors are associated costs in computer resources used in generating and storing the test vectors, and in tester memory and time needed to download test data to the tester.

In view of the foregoing, a method and system for efficiently handling test vector data which addresses the noted concerns is needed.

SUMMARY OF THE INVENTION

A method and system according to the present invention provides for highly compressible test vectors to be formed, allowing substantial economies in computer resources, tester memory requirements and test processing time.

According to the new invention, the test response output data are compressed into a much more compact data representation by using error-detecting data compression means. In an embodiment, the response data are compressed into signatures using Cyclic Redundancy Check (CRC) codes. The CRC-based signatures can be generated by hardware that is located in the product under test, inside the tester, or between the product under test and the tester, or by software in the tester. The amount of expected signature data that needs to be stored on the tester for comparison is much smaller than the total amount of test output response data produced by the product under test.

Furthermore, according to the invention, filling the non-care bits in the test input stimulus vector data set with repetitive, repeated, or other algorithmically generated value sequences forms a highly compressible test vector data set. A further reduction in the input stimulus data can be achieved by allowing a substantial portion of the care bits also to be set to repetitive, repeated, or other algorithmically generated value sequences. The proposed combination of data compression techniques for both, test input stimulus data and test output response data, results in significantly better overall data reduction than the use of either method by itself.

In an embodiment, the highly compressible test input stimulus vector data set comprises a differential test vector data set. An "exclusive OR" (XOR) operation may be performed between the original care bits of the test vector data and a background vector data set, to generate the differential vector data set. In the differential data set, a substantial portion of bits corresponding to the original care bits may be set to a value of 0 (zero). Bit positions in the differential vector data set corresponding to the non-care bits of the original test vector data are filled with 0s. The background vector data is constructed in a way that permits easy algorithmic generation of the fill data values from a small amount of initialization data using software residing in the tester and operating while the test is performed, hardware that is located in the product under test, inside the tester, or between the tester and the product under test and is operating while the test is performed, or by software used for preparing the tester program and associated data loaded into the tester prior to testing.

The repetitive values of 0 generated in the differential vector data set increase the compressibility of the differential vector data set. The differential vector data set may be compressed to economize on memory and storage requirements in stages of a testing process, and subsequently decompressed to recover the original care bits of the test vector data set when it is to be loaded into input latches.

A method and system according to the present invention provides for highly compressible test vectors to be formed, allowing substantial economies in computer resources, tester memory requirements and test processing time.

According to the invention, a highly compressible test vector data set is formed by filling the non-care bits in the test vector data set with repetitive or repeated values. A substantial portion of the care bits may also be set to repetitive values.

In an embodiment, the highly compressible test vector data set comprises a differential test vector data set. An "exclusive OR" (XOR) operation may be performed between the original care bits of the test vector data and a background vector data set, to generate the differential vector data set. In the differential data set, a substantial portion of bits corresponding to the original care bits may be set to a value of 0 (zero). Bit positions in the differential vector data set corresponding to the non-care bits of the original test vector data are filled with 0s.

The repetitive values of 0 generated in the differential vector data set increase the compressibility of the differential vector data set. The differential vector data set may be compressed to economize on memory and storage requirements in stages of a testing process, and subsequently decompressed to recover the original care bits of the test vector data set when it is to be loaded into input latches in a tester.

DETAILED DESCRIPTION OF THE INVENTION

Previous methods for reducing the volume of test data stored on Automatic Test Equipment (ATE) for testing scan-based designs have focused on reducing the number of tests by means of merging tests for as many individual target faults as possible into a single scan test. The sophistication of the algorithms used for test merging have matured to a point where further gains are limited. Also, stimulus data compaction on the ATE using constant or repeat-count values for filling in don't care bit values have been practiced in the past.

Figure 1:
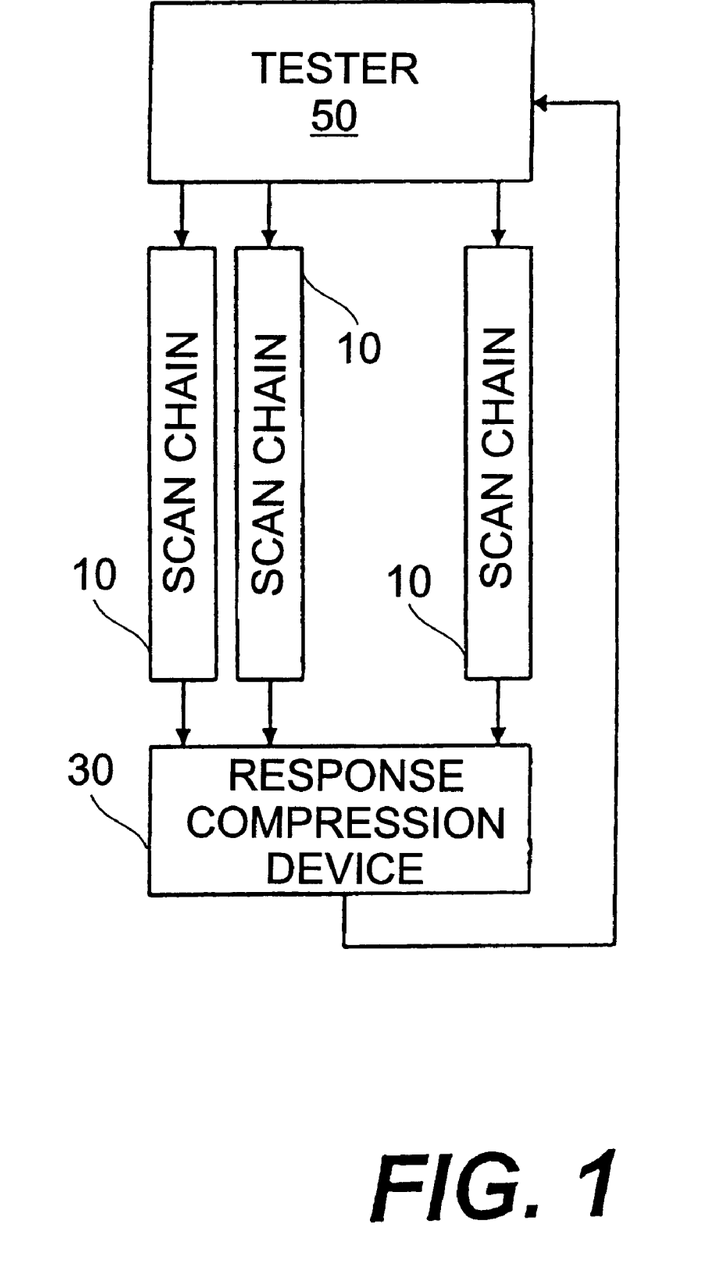
FIG. 1 illustrates the hardware structure used for testing, with a response data compression device that accumulates the response data from the scan chains.

FIG. 1 is a block diagram that illustrates the overall configuration used during test. A tester is connected to multiple scan chains 10 in the product under test. Test input stimuli are serially shifted into the scan chains in the product under test. After the loading is completed, the test can commence and test response data are captured into the scan chains in the product under test. The captured responses are serially shifted out into a reponse data compression device 30, such as a MISR (Multiple-Input Signature Register), in a serial fashion. The response data compression device 30 accumulates the serial response data streams into an error detecting code word called "signature". The tester 50 does not participate in the accumulation or generation of the signature. Hence, the tester interface is available to shift new input stimuli into the scan chains in the product under concurrently with shifting the current set of captured responses out into the response data compression means. The width (number of bits) of the signature word accumulated by the response data compression device generally is equivalent to the number of scan chains. Each scan chain in complex microlectronic porducts may contain several thousands of scan cell bits. Hence, the total number of bits in the signature is by several orders of magnitude less than the total number of reponse bits. At the end of the combined serial load/unload operation, the signature is transferred to the tester and compared with a pre-calculated expected signature word. Only the expected signature word needs to be stored in the tester buffer memory, meaning that the amount of response-related data that is stored on the tester is rather insignificant compared to the traditional method of storing the full set of expected responses for all scan cell bits. Roughly speaking, the amount of data normally stored on the tester without compression (like a MISR) is about 50% input stimulus data and 50% output stimulus data. By removing the 50% output stimulus data via compression, the tester data are now dominated by the input stimulus data, and any reduction in the amount of stimulus data now affects the majority of the data volume—at lease 95%.

The input stimulus data for scan based testing arrangements like the one illustrated in FIG. 1 typically are derived by Automatic Test Pattern Generation (ATPG) software from a computer-readable model of the product under test. It should be appreciated for the context of the proposed improved test apparatus and method that ATPG software algorithms allow for substantial flexibility in how a large portion of the stimulus data content is constructed. The ATPG software algorithm options can be intelligently selected in such a way that said software algorithms are compatible with software and/or hardware algorithms available in the tester. The respective data content then can be recreated on the tester by the software/hardware algorithm from a minimal amount of initialization data rather than having to be stored in a bit-for-bit fashion in the tester buffer memory. This freedom in selecting the algorithms used in ATPG is described below which indicates how the amount of input stimulus data can be reduced by matching the software algorithm used in ATPG with software/hardware algorithms used on the tester. The total tester data reduction possible is limited by the remaining amount of compressed input stimulus data plus the amount of uncompressed expected reponse data. It has been found that by combining the advantage of reduced input stimulus data achieved with the additional significant data reduction may be achieved by the use of response data compression device 30 as illustrated in FIG. 1.

Figure 2:
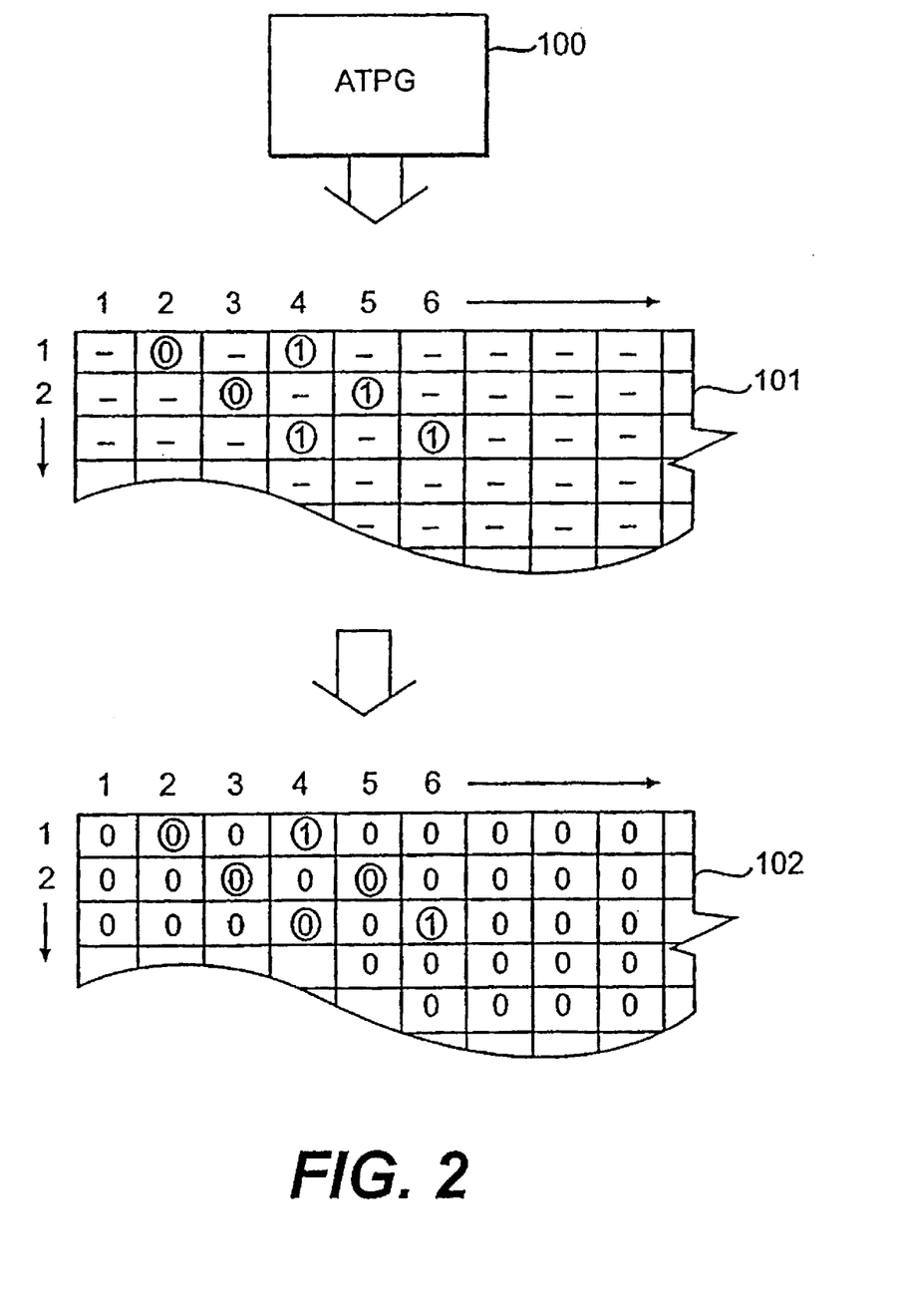
FIG. 2 illustrates a process flow for creating highly compressible test vectors from original test vector data by filling bit positions with repeated values.

FIG. 2 is a flow chart illustrating the creation of a highly compressible test vector data set according to the invention. Original test vector data, for example, a distribution of 0s and 1s as shown in block 101, may be generated by known means such as Automatic Test Pattern Generation (ATPG) software 100. The ATPG software utilizes a representation of the combinational logic being tested to generate care bits which target focal faults in the logic circuitry. The care bits may be 0s or 1s. In block 101, the care bits are circled and the non-care bits are indicated by dashes (-). The non-care bits may be 1s or 0s. Each row of block 101 represents a test vector.

Typically, ATPG-generated test vectors for large (1+million gate) circuits, on average, contain less than 1 care bit for every 100 scan chain bits. Thus, care bits are very sparsely distributed throughout the test vectors. The present invention takes advantage of this characteristic of the test vectors by filling the non-care bit positions with repetitive values to increase the compressibility of the test vectors. The non-care bit positions of the test vectors are filled with all 0s, as shown in block 102. A substantial portion of the original care bits may also be set to 0, and their original values subsequently recovered. The test vector data, with non-care bit positions filled as described and having a substantial number of the original care bits set to 0, is consequently highly compressible due to being dominated by 0s. The test vector data may then be compressed and subsequently decompressed for loading into input latches of a logic product, as described in greater detail in the following.

Figure 3:
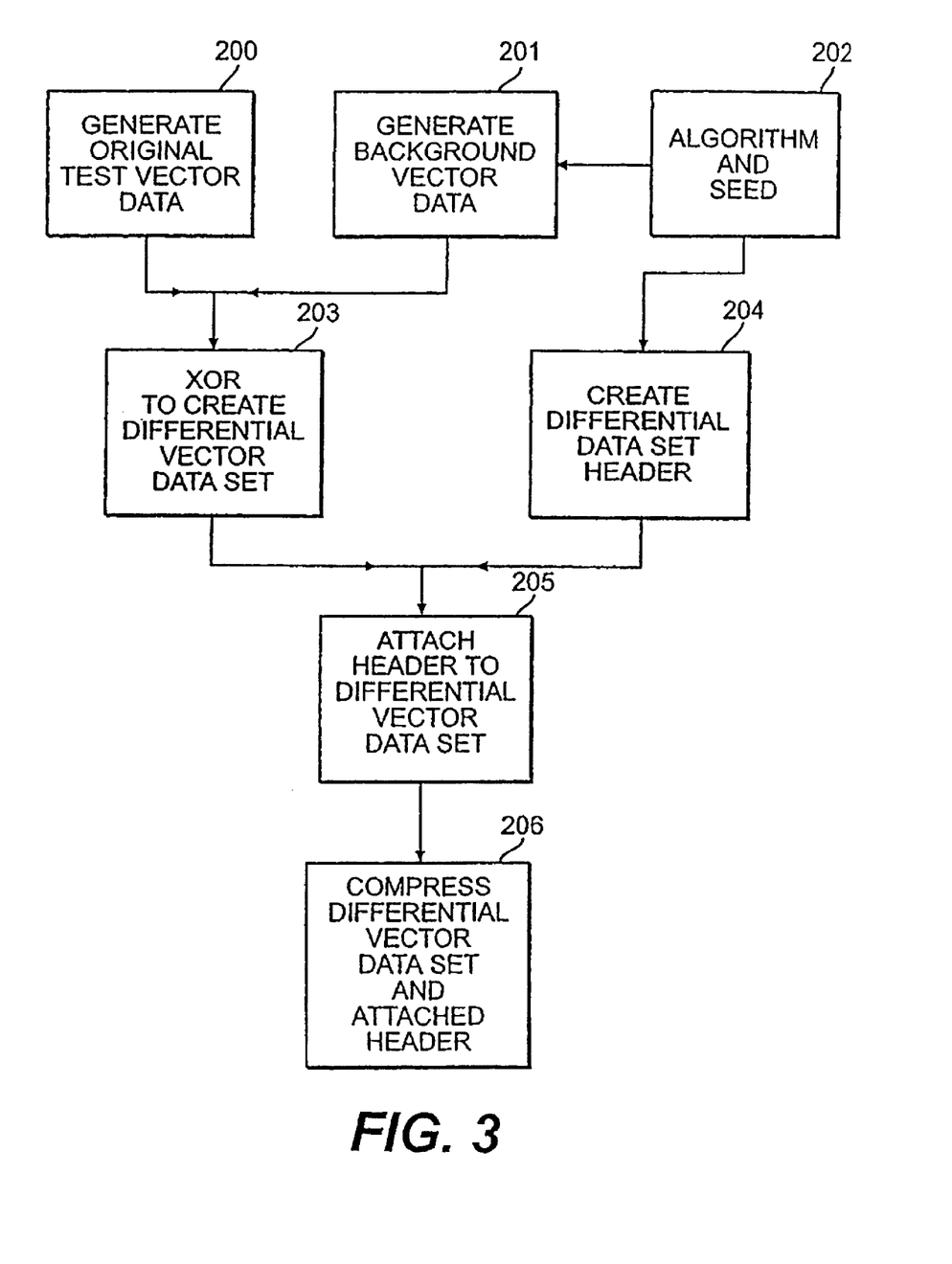
FIG. 3 shows a process flow for creating a compressed test vector data set.

Referring now to FIG. 3, according to an embodiment of the invention, original test vector data is generated as shown in block 200, and background vectors are also generated as shown in block 201. The background vectors may be all 0s, all 1s, or a random distribution of 0s and 1s. A known software algorithm and seed may be used to generate the background vectors as shown in Block 202. A "seed" refers to a data string of a comparatively limited size which is used in combination with the algorithm to generate the background vector data set. The background vector data set, when XORed with the care bits of the original test vector data, will typically produce a differential vector data set in which a substantial portion of bits corresponding to the care bits of the original test vector data are set to 0. Independently of the XOR operation, the non-care bits of the differential vector data set are also set to 0, thereby forming a highly compressible test vector data set from the original test vector data. The original test vector care bits, with the non-care bits having values determined by the background vector data, may be recovered from a compressed differential vector data set as described in greater detail below.

As shown in Block 203, the logical operation "exclusive OR" (XOR) is performed between the original test vectors and the background vectors to create a differential vector data set. Only the care bits of the test vectors are XORed, with corresponding bits of the background vectors. Accordingly, if a background vector data bit corresponding to a care bit has a value of 0, the care bit in the resulting differential vector will be unchanged from its value in the original test vector. On the other hand, if a background vector data bit corresponding to a care bit has a value of 1, the care bit in the resulting differential vector will be flipped or reversed from its value in the original test vector. Independently of the XOR operation, the non-care bits in the differential vector data are set to 0 by, for example, a software algorithm.

If the background vectors generated contain a random fill pattern, (a random distribution of both 1s and 0s), it is typical that half of the care bits in the test vectors generated by the ATPG software will tend to match the corresponding values in the randomly generated background vector. Accordingly, an XOR of the background vectors and the test vectors will result in a differential vector data set in which approximately half of the bits corresponding to the care bits of original test data are set to 0. Thus, after the non-care bit positions are filled with 0s, the differential vector data set will typically be dominated by over 99% 0s, making it highly compressible.

As shown in block 204, a data set header identifying the algorithm and seed used to generate the background vectors may be created, and attached to the differential vector data set as shown in block 205. The differential vectors with attached header may then be compressed using known compression means, as shown in Block 206.

Figure 4:
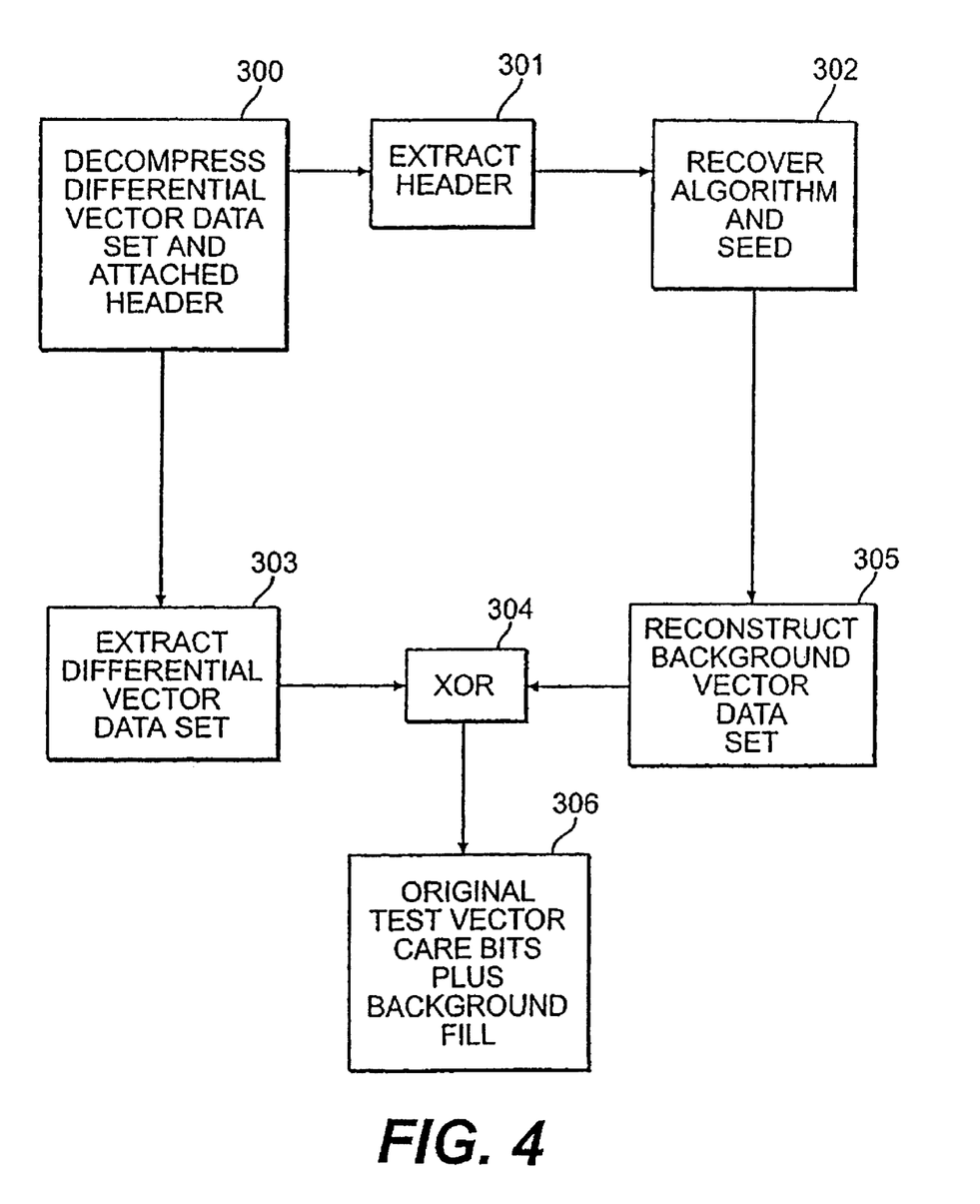
FIG. 4 illustrates a process for recovering original test vector data from a compressed test vector data set.

FIG. 3 is a flow chart illustrating the recovery of the original test vector data care bits from the differential data set. As shown in Block 300, the compressed differential vector data set plus header is decompressed. The header data attached is extracted, and the algorithm and seed used to generate the background vector data set are recovered, as shown in blocks 301 and 302. Also, the differential vector data set is extracted from the decompressed data as shown in Block 303.

With the algorithm and seed recovered, it is possible to reconstruct the background vector data set as shown in Block 305. As shown in Blocks 304 and 306, an XOR between the differential data set and the reconstructed background data set results in a reconstructed test vector data set which reproduces the original test vector care bits, with the non-care bit positions being filled with the corresponding values from the background vector data.

Figure 5A:
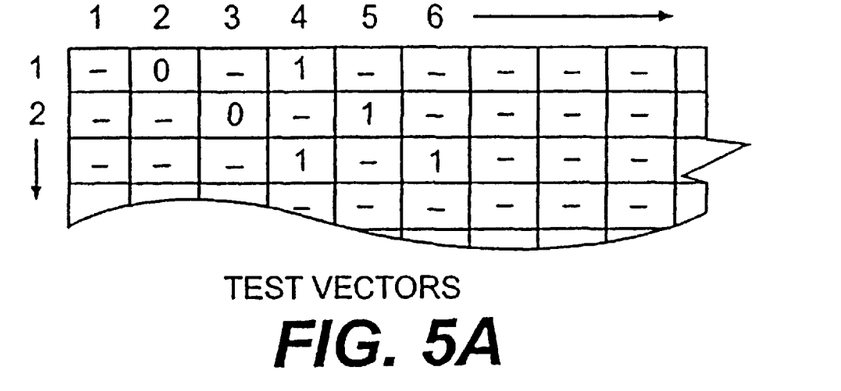
FIGS. 5A–5C show an example of a test vector data set, a randomly-generated background vector data set, and the differential vector data set resulting from XORing the test vectors and background vectors.
Figure 5B:
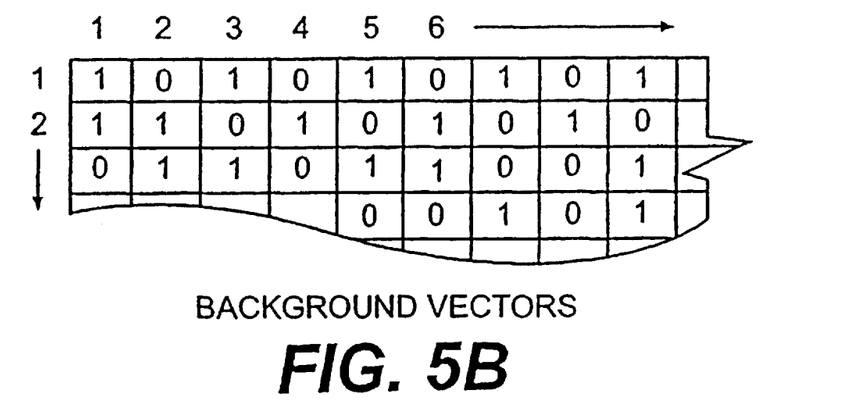
Figure 5C:
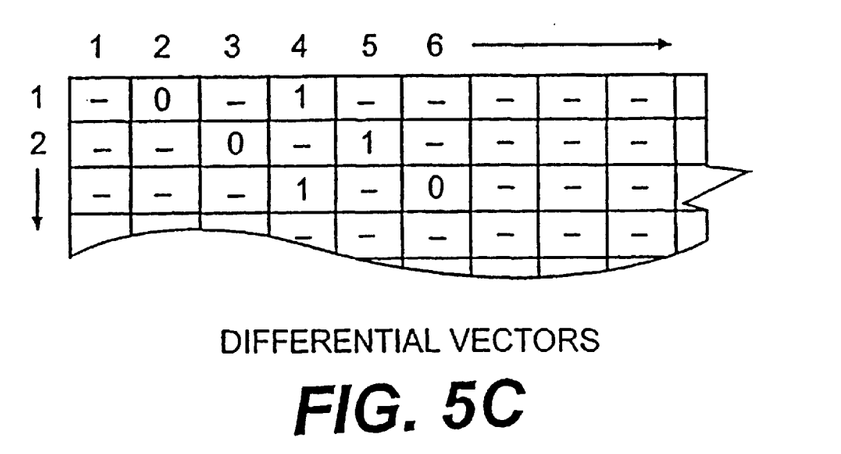

FIGS. 5A–5C illustrate the XOR operation to create the differential vectors. FIG. 5A shows an example of a test vector data set such as might be generated by ATPG software, prior to compression according to the present invention. The test vector data set includes care bits at row 1, columns 2 and 4, row 2, columns 3 and 5, and row 3, columns 4 and 6. Non-care bits are illustrated by dashes. FIG. 5B shows an example of a background vector data set such as might be generated by a random fill algorithm.

FIG. 5C shows a differential vector data set resulting from performing an XOR operation between the test vector data set illustrated in FIG. 5A and the background vector data set shown in FIG. 5B, for only the care bits and corresponding background vector bits. It may be noted that in the differential vector data set shown in FIG. 5C, the bit position at row 3, column 6, corresponding to the care bit at row 3, column 6 of the test vector data set shown in FIG. 5A, has been changed from a 1 to a 0. As discussed above, it has been observed that typical ATPG-generated test vectors on average contain less than 1 care bit for everyone 100 scan chain bits, and half of the care bits will tend to match the values in a randomly generated background vector. Accordingly, the XOR operation will tend to set half of the care bits to 0 in the corresponding differential vector data set, yielding a high degree of compressibility.

A further advantage is offered by using random fill background vector data sets. When the background vector data set is reconstructed and XORed with the decompressed differential vector data set, the resulting data set will include the care bits of the original test vector data set, with the non-care bits being randomly filled by the background vector data set. When this resulting data set is subsequently loaded into the input latches of a logic product to conduct a test, there is the possibility that the randomly distributed background fill data will detect faults in addition to those detected by the care bits, which are targeted at focal faults. This may be referred to as "fortuitous" fault detection.

Figure 6:
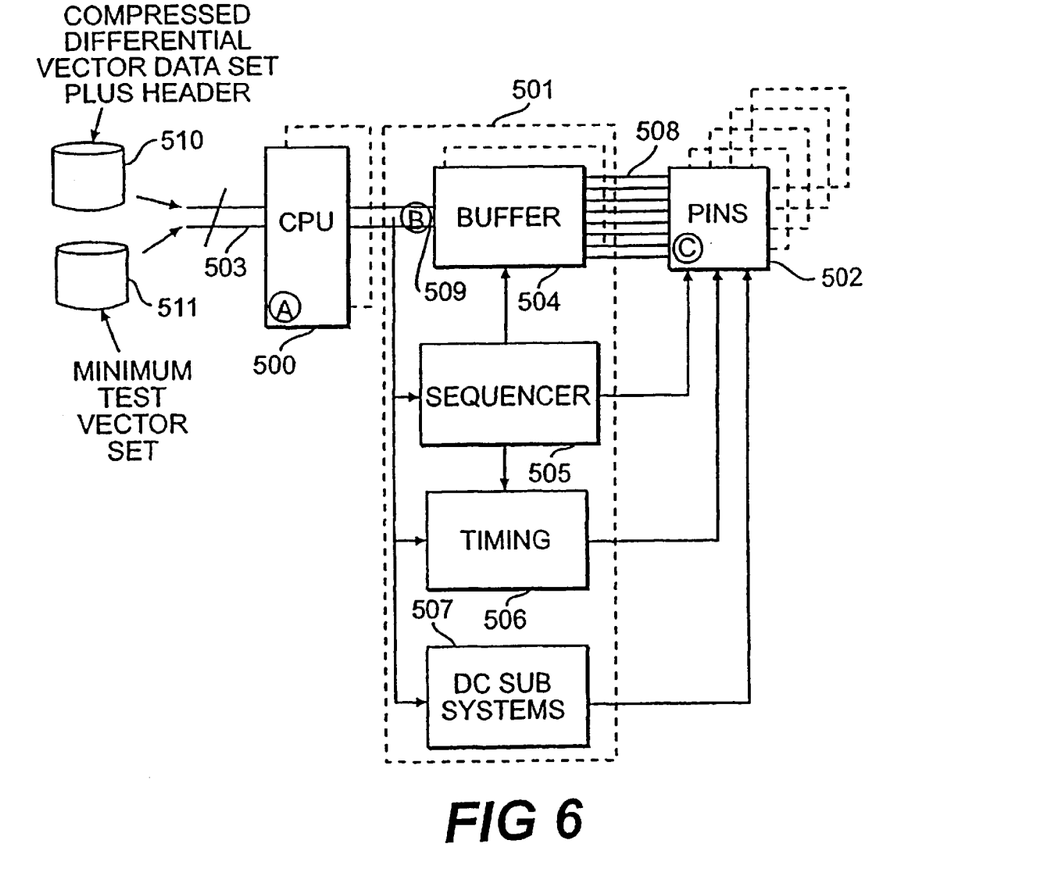
FIG. 6 illustrates a testing system for testing logic products according to the present invention, illustrating stages at which original test vector data may be reconstructed to load input latches to test logic products.

FIG. 6 shows a test system including major components of a tester 501 for implementing the invention. An I/O bus 503 allows data flow to a central processing unit (CPU) 500 of, for example, a personal computer connected to the tester. The CPU is connected to a memory buffer 504 of the tester by a second bus 509. Via pin connections 508, the buffer 504 fans out data to individual chip test pins on logic products 502 to load input latches therein with test vectors.

The tester further comprises a sequencer 505 for determining the sequence of patterns for applying the test vectors loaded into the input latches, timing logic 506 for determining the rate at which to run the logic product, and DC subsystems 507 for applying the appropriate voltage levels to the logic product.

Typically, a compressed differential vector data set plus header 510 is created by a computer system external to the tester. The computer system which generates the test data may be at a different physical site from the tester, which is typically located in a manufacturing environment. The computer system executes ATPG software to generate original test vector data, and executes software for performing the algorithm to generate background vectors and XOR the background vectors with the care bits of the original test vectors. The compression of the resulting differential vectors plus attached header also takes place externally to the tester. Certain of the foregoing operations, such as the compression, may be performed in hardware. Compression of the differential vector plus header data provides for economizing on computer resources at the site generating the test data, including memory, disk storage or portable storage resources such as diskettes, CD-ROMs, tapes and the like. The compressed test data may also be transmitted over connections of a computer network in less time as compared to the original test data, and downloaded to a tester more efficiently, from either a network or a portable storage source At the tester, the compressed differential vector data set plus header 510 may be input to CPU 500 via I/O bus 503. Points A, B and C in FIG. 6 represent points where decompression of the differential vector data set plus header may be done. Decompression could be performed by software at point A, or by hardware at points B (tester hardware) and C (hardware built in to the logic product). As discussed above in connection with FIG. 3, the decompression would be followed by the steps of extracting the differential vector data set, and extracting the header to recover the algorithm and seed required to reconstruct the background vectors. The XOR operation between the differential vector data set and reconstructed background vector data set to recover the original test vector care bits plus background fill bits could be performed at the same point that which decompression was performed, or at any point further downstream from the decompress operation. For best results in terms of tester memory buffer conservation, the decompression would take place at point C, in hardware embodied in the logic product itself In view of the above, it may be appreciated that the compressibility of the differential vector allows computer resources including memory, storage and data transmission time, to be conserved at processing stages preceding the loading of scan chains into the input latches of a logic product being tested. When processing has reached a point where the input latches are to be loaded, the original test vector care bits plus background fill are recreated from the compressed differential vector plus header, and loaded into the input latches.

An alternative "repeat last fill" embodiment of the present invention, as described hereinafter, generates repetitive or redundant test vectors and utilizes a "repeat" capability of the tester to economize on memory and storage requirements. Typically, commercially available testers have the capability to repeat data such as the strings of 1s and 0s forming test vectors, and load the repeated strings into specified input latches of a logic product.

Figure 7A:
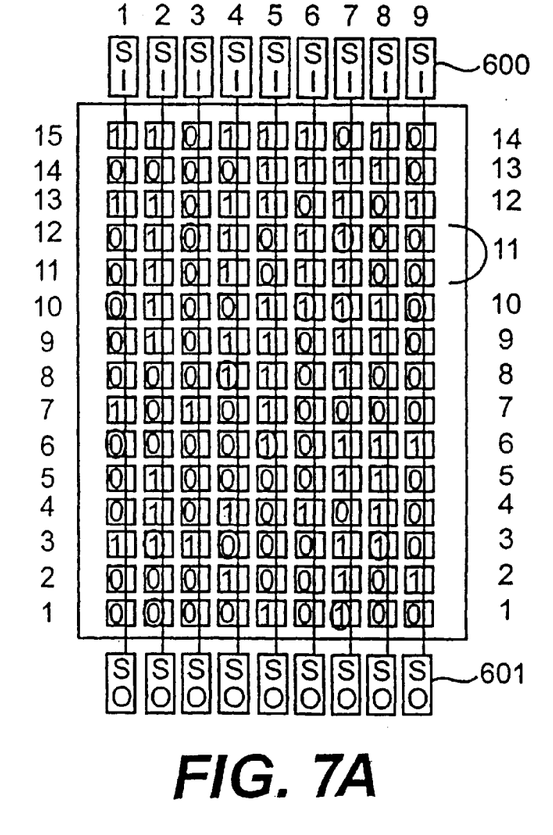
FIG. 7A shows an example of input latches in a logic product loaded with test vectors.

FIG. 7A shows an example of input or scan latches in a logic product loaded with test vector data. The test vector data is arranged between scan-in inputs 600 and scan-out outputs 601, and may be viewed as a matrix comprising rows and columns of test vector data. As described earlier, the test vector data is loaded via the scan-in inputs prior to being released via the scan-out outputs to combinational logic in a logic product for detecting faults therein. In the example shown in FIG. 7A, each of rows 1–15 represents a nine-bit test vector. The circled bits are care bits.

It is noted that the vectors at rows 11 and 12 of FIG. 7A are identical. The repeat capability of testers can be used to take advantage of such duplication occurring in test vector data to reduce the amount of data which must be stored. As can be seen by the row designations on the right side of FIG. 7A, a single test vector 11 may be used to fill both row positions 11 and 12.

Figure 7B:
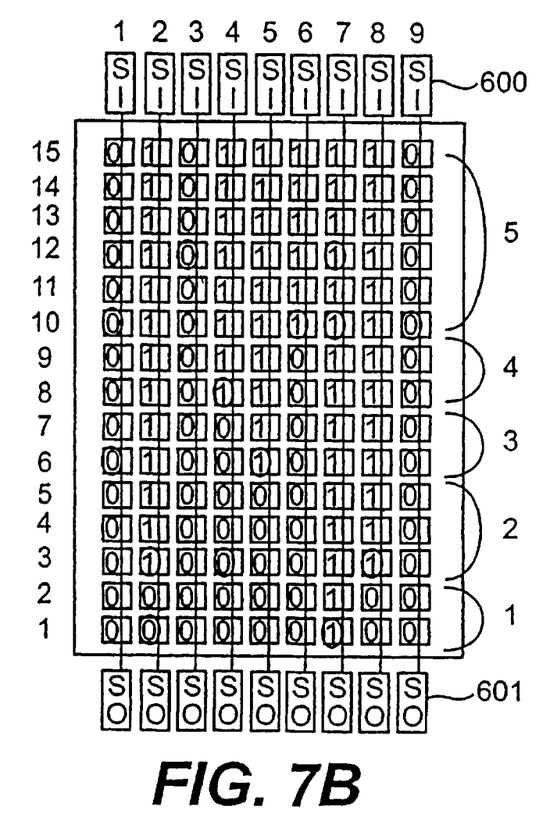
FIG. 7B shows an example of the test vector data shown in FIG. 7A after processing according to a "repeat last care bit" step of the invention.

FIG. 7B shows an example of the input latches of FIG. 7A wherein the test vectors have been processed according to the invention. Considering the rows of test vectors in ascending order, each care bit has been replicated in the rows above it in the corresponding column, until another care bit is encountered with a different value. If a care bit with a different value is encountered, the non-care bit positions are filled with that different care bit value in the ascending row positions in the corresponding column.

As a specific example, consider column 2 of FIG. 7B. At row 1, there is a care bit having a value of 0. Accordingly, according to the invention the non-care bit at column 2, row 2 is assigned a value of 0. Then, at row 3, a care bit having a value of 1 is encountered. Accordingly, the non-care bits at column 2, rows 4–15 are assigned the value of 1, since no other care bit having a different value is present in the column.

As another specific example, consider column 4. There is a care bit in row 3, column 4 having a value of 0. Accordingly, the non-care bits in rows 4–7 of column 4 are assigned the value 0. At row 8 of column 4, a care bit having a value of 1 is encountered, and accordingly, the non-care bits in rows 9–15 of column 4 are assigned the value of 1.

It may observed from FIG. 7B that only five distinct test vectors need to be stored. The input latches of the logic product may be loaded using the repeat capabilities of the tester to reproduce each distinct test vector as often as needed.

Redundant vectors as described above could be created by a software algorithm; for example, software which interfaced with ATPG software executed on a computer system upstream from the tester. The algorithm would take as input the original test vectors, locate the care bits, and repeat them as described above. For better data compaction, the redundant vectors could be further processed to reduce them to a minimum set of distinct vectors. Such a minimum set, represented by element 511 in FIG. 5, would then be transmitted to the tester, along with information specifying how often and where in the input latches the vectors were to be repeated.

The sparseness of the care bits is a factor in generating redundant test vectors by using the technique of repeating the last care bit. Because care bits are sparsely distributed, the probability favors the phenomenon that repeating the care bits in the non-care bit position as described above will generate duplicate test vectors.

As discussed above, random filling of the non-care bit positions in the test vectors occasions the phenomenon of "fortuitous" fault detection while testing targeted or focal faults with the care bits. Fortuitous fault detection allows numerous faults to be detected in fewer tests than would otherwise be the case.

However, there is a point of diminishing returns where using random fill no longer offers the best test economy. As faults continue to be detected, the number of non-care latches continues to increase to a point where there are very few care latches. There are also many fewer faults remaining to be detected.

Thus, at a point in the testing process, it has been observed that better test economy can be achieved by using random-fill test vectors during a first period of testing, followed by a second or subsequent period of using the "repeat last fill" technique of generating a reduced or minimum set of vectors and repeating them, as described above.

Accordingly, the present invention further includes applying a first testing technique to logic products during a first testing period, the first testing technique comprising loading input latches of a tester with test vectors comprising a random distribution of bits. The first testing period is followed by a second testing period of applying a second testing technique comprising loading input latches by repeating test vectors of a minimum set of test vectors obtained by repeating a last care bit in neighboring non-care bit positions as described above.

Of a full or complete testing period defined as one during which the number of faults detected has been reduced to an acceptable level, one proportion of the first period to the second period that is contemplated is approximately 95% to 5%; i.e., 95% of the faults with random-fill testing followed by approximately 5% with repeat-last-fill testing. The first 95% of the faults are the easier faults and the first period will typically require 10% or less of the test patterns. The second period will contain the large majority of test patterns and use the repeat-last-fill testing method.

In conceivable embodiments, the invention is implemented in computer-executable instructions which when executed perform method steps of the invention. The instructions are embodied in a program module or modules stored on computer-usable media. When executed by a processor, the instructions would accept as input ATPG-generated test vector data. The instructions would generate the background vector data using the algorithm and seed as discussed above in connection with FIG. 3. Subsequently, the instructions would XOR the care bits of the test vector data with the background vector data to create the highly-compressible differential vector data, and create and attach the header as discussed. Compression of the differential vector data, while preferably taking place in hardware for greater speed, could also be implemented in software.

Recovery of the original test vector data care bits plus background fill data as discussed above in connection with FIG. 4 could also be performed by computer-executable instructions according to the invention, at, for example, point A in FIG. 6, as noted above.

Computer-executable instructions for generating redundant test vectors by repeating a last-encountered care bit as described in connection with FIGS. 7A and 7B, and reducing the redundant test vectors to a distinct set, are also encompassed by the invention.

Figure 8:
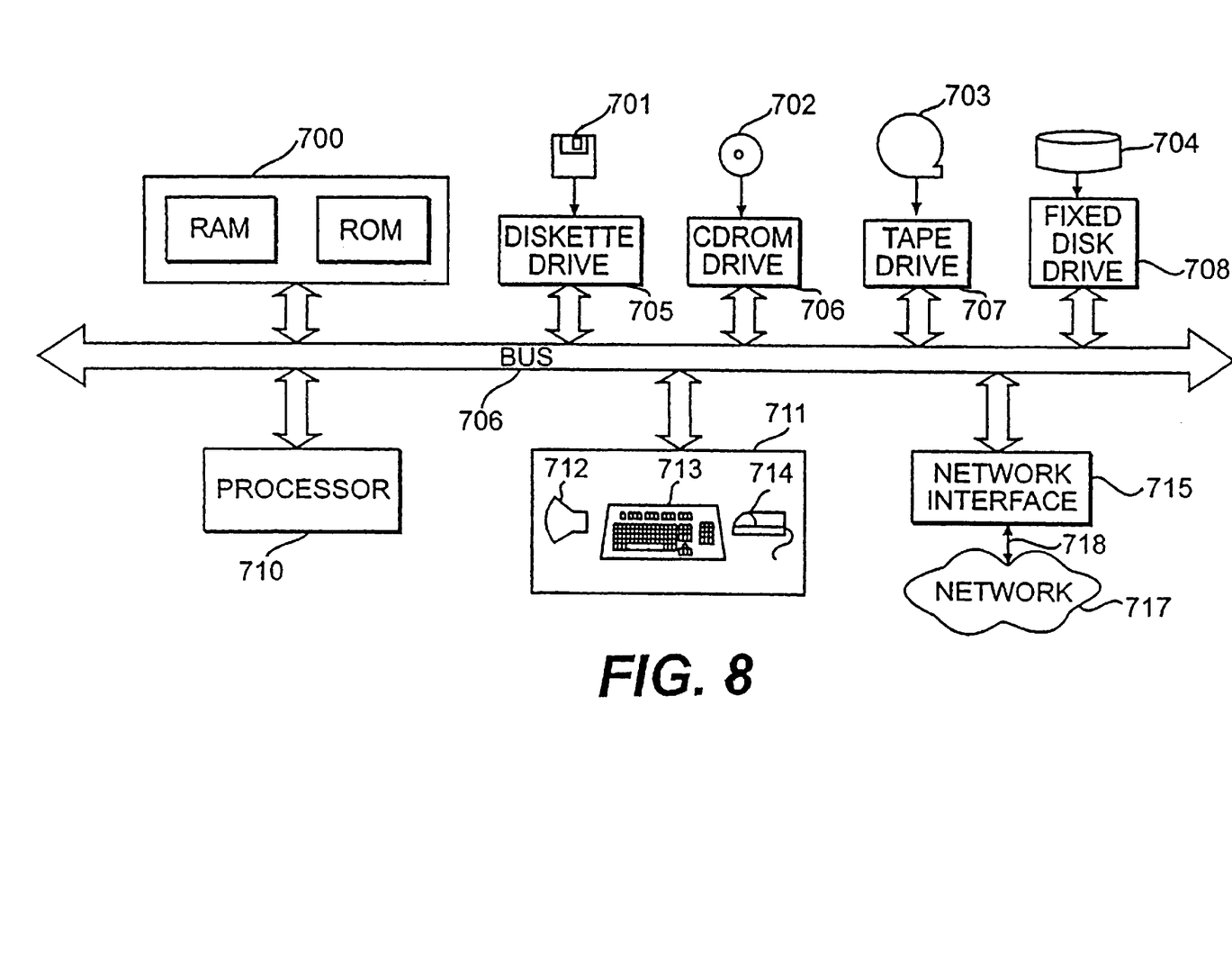
FIG. 8 shows a general purpose computer system for executing software according to the invention.

FIG. 8 shows a high-level representation of a general purpose computer system for implementing an embodiment of the invention in the form of computer-executable instructions, such as might be realized by a variety of known and commercially available hardware and software elements. The system comprises a memory 700 including a ROM and RAM, processor 710 and user interface 711 comprising a video display 712, keyboard 713 and mouse 714. Elements may communicate via system bus 706. The system may further be connected to a network 717 via a network medium 718 and network 715.

A computer program or a collection of programs comprising computer-executable instructions for performing method steps according to the present invention may be stored and transported on computer-usable media such as diskette 701, CD-ROM 702, magnetic tape 703 and fixed disk 704. To perform the steps of the method, the instructions may be retrieved from the computer-usable media 701–704 using their respective drives 705–708 into memory 700 and executed by a processor 710. The method disclosed hereinabove may find specific implementations in a variety of programming structures and data forms, which are considered to be within the abilities of a programmer of ordinary skill in the art after having reviewed the specification.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention as such, or other, embodiments and with the various modifications required by the particular applications or uses or the invention. Accordingly, the description is not intended to limit the invention to the form disclosed herein. Also, it is intended that the appended claims be construed to include alternative embodiments.

What is claimed is:

1. A method for reducing test data volume in the testing of logic product under test, comprising the steps of:
   (a) generating original test vector data including care bits and non-care bits;
   (b) filling said non-care bits with a repeated value to form a highly compressible test vector data set;
   (c) compressing said highly compressible test vector data set to form a compressed test vector data set;
   (d) simulating the product under test with test input data to determine expected test response data generated from the product under test in response to the original test vector data;
   (e) compressing the expected test response data into a compact error-detecting expected signature.

2. The method of claim 1, further comprising the steps of:
   (f) transmitting said compressed test vector data set to a test system;
   (g) recovering the care bits of said original test vector data from said compressed vector data set, for loading said original test vector data into input latches of a tester in said test system;
   (h) compressing actual test response data from the product under test into a compact error-detecting actual signature; and
   (i) comparing said error-detecting actual signature with said error-detecting expected signature for the test.

3. The method of claim 2 wherein said step (g) comprises:
   decompressing said compressed test vector data set;
   extracting a differential vector data set and attached header, said differential vector data set formed by XORing said care bits with corresponding bits in a background vector data set;
   reconstructing said background vector data set from said header; and
   XORing said reconstructed background vector data set with said extracted differential vector data set to form a reconstructed test vector data set.

4. The method of claim 3, wherein said reconstructed test vector data set comprises the care bits of the original test vector data, with the non-care bits having the values of the corresponding background vector data bits.

5. The method of claim 2 wherein said response data compression is performed by hardware in the product under test.

6. The method of claim 5 wherein said hardware implements an error-detecting Cyclic Redundacy Code generator.

7. The method of claim 2 wherein said response data compression is performed by hardware located between the product under test and the tester.

8. The method of claim 7 wherein said hardware implements an error-detecting Cyclic Redundacy Code generator.

9. The method of claim 2 wherein said response data compression is performed by hardware located inside the tester.

10. The method of claim 9 wherein said hardware implements an error-detecting Cyclic Redundacy Code generator.

11. The method of claim 2 wherein said response data compression is performed by software means located in the tester.

12. The method of claim 11 wherein said software means implement an error-detecting Cyclic Redundacy Code generator.

13. The method of claim 2 wherein said response data compression is performed by a software or hardware means, the software or hardware means is reset to a fixed, predetermined value at the beginning of each test such that the said error-detecting actual signature obtained for the test is independent of the signatures from prior tests.

14. The method of claim 2 wherein said step (i) comprising the steps of:

(j) repeating one or more failing tests for which of said error-detecting actual signature is different from said error-detecting expected signature using the same test input stimulus data as used for creating said error-detecting actual signature; and (k) unloading the test output response data for the said repeated failing tests to the tester without compressing said test output response data.

15. The method of claim 1, wherein said step (b) comprises:

generating a background vector data set; and forming a differential vector data set by XORing said care bits with corresponding bits in said background vector data set.

16. The method of claim 15, wherein said XORing sets a substantial portion of said care bits to a value of 0 in said differential vector data set.

17. The method of claim 15, further comprising the step of attaching a header to said differential vector data set, said header identifying an algorithm and seed used to generate said background vector data set, wherein said differential vector data set with attached header form said highly compressible test vector data set.

18. The method of claim 15, wherein said background vector data set comprises a random distribution of bits having values of both "0" and "1".

* * * * *